United States Patent
Komobuchi et al.

(10) Patent No.: US 6,392,700 B1
(45) Date of Patent: May 21, 2002

(54) SOLID STATE IMAGE PICKUP DEVICE AND ITS DRIVING METHOD USING TWO DIFFERENT PERIODS IN A FIELD OR FRAME

(75) Inventors: Hiroyoshi Komobuchi, Kyoto; Yuuji Matsuda, Takatsuki, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 08/918,424

(22) Filed: Aug. 26, 1997

Related U.S. Application Data

(62) Division of application No. 08/726,337, filed on Oct. 3, 1996, now abandoned, which is a continuation of application No. 08/261,841, filed on Jun. 17, 1994, now abandoned.

(30) Foreign Application Priority Data

Jun. 17, 1993 (JP) ............................................. 5-145887

(51) Int. Cl.[7] ............................................... H04N 3/14
(52) U.S. Cl. ....................... 348/311; 348/312; 348/323; 348/298
(58) Field of Search ................................ 348/311, 315, 348/317, 319, 320, 331, 322, 323, 241, 256, 298, 312

(56) References Cited

U.S. PATENT DOCUMENTS

| | | | |
|---|---|---|---|
| 4,862,487 A | | 8/1989 | Ando et al. |
| 4,974,093 A | * | 11/1990 | Murayana et al. ........... 348/308 |
| 5,083,209 A | | 1/1992 | Inoue et al. |
| 5,229,857 A | * | 7/1993 | Tanji ............................ 348/312 |
| 5,264,944 A | * | 11/1993 | Takemura .................... 348/224 |
| 5,387,935 A | | 2/1995 | Kobayashi |
| 5,438,365 A | * | 8/1995 | Yamashita ................... 348/297 |
| 5,455,621 A | * | 10/1995 | Morimura .................... 348/229 |
| 5,463,421 A | | 10/1995 | Deguchi et al. |
| 5,572,256 A | * | 11/1996 | Egawa et al. ................ 348/317 |
| 5,659,359 A | * | 8/1997 | Mochizuki et al. ......... 348/317 |
| 5,917,546 A | * | 6/1999 | Fukui ........................... 348/321 |

FOREIGN PATENT DOCUMENTS

| | | | |
|---|---|---|---|
| EP | 0 241 800 | 10/1987 | |
| EP | 0 487 332 | 5/1992 | |
| GB | 0 487332 A2 | * 5/1992 | ............ H04N/3/15 |
| JP | 62208668 | 9/1987 | |
| JP | 61-244759 | * 4/1988 | |
| JP | 63-250980 | 10/1988 | |
| JP | 1314066 | 12/1989 | |
| JP | 3104386 | 5/1991 | |
| JP | 3117281 | 5/1991 | |
| JP | 3153176 | 7/1991 | |

OTHER PUBLICATIONS

European Search Report dated Sep. 21, 1994.
European Search Report dated Mar. 1, 1995.

* cited by examiner

*Primary Examiner*—Wendy R. Garber
*Assistant Examiner*—Luong Nguyen
(74) *Attorney, Agent, or Firm*—Ratner & Prestia

(57) ABSTRACT

A method and apparatus for driving a solid state image pickup device. The method and apparatus include setting a first signal charging period and a second signal charging period during one frame or field of a video signal for each one of a plurality of unit pixels. The second signal charging period is shorter than the first signal charging period. A first signal charge is produced during the first signal charging period and a second signal charge is produced during the second signal charging period. It is judged whether the first signal charge is saturated or not saturated. Then based on this judgment an input light amount is determined. The input light amount is determined using only the second signal charge when the first signal charge is saturated. The input light amount is determined using only the first signal charge when the first signal charge is not satrated.

9 Claims, 10 Drawing Sheets

SOLID STATE IMAGE PICKUP DEVICE AND ITS DRIVING METHOD USING TWO DIFFERENT PERIODS IN A FIELD OR FRAME

This application is a division of application Ser. No. 08/726,337, filed Oct. 3, 1996, (status: abandoned), which is a continuation of application Ser. No. 08/261,841 filed Jun. 17, 1994 (now abandoned but which is relied upon for an earlier filing date under 35 U.S.C. §120).

BACKGROUND OF THE INVENTION

1. Field of the Invention

The present invention relates to a solid state image pickup device for expanding the management range in the quantity of incident light in the high-luminance side and a method for driving the same, and in particular, to a solid state image pickup device for expanding the management range of the quantity of incident light for elevated luminances by setting up at least two signal charging periods in the specified period represented by the field or frame of a video signal and reproducing the signal charges in the signal charging period without using any external field memory or any frame memory and a method for driving the same.

2. Related Art of the Invention

According to a conventional technique, at least two mutually-different charging periods are set in one frame or one field in expanding the management range in quantity of incident light. For example, a first charging period T1 corresponding to the conventional vertical scanning period and a second charging period T2 shorter than the first charging period in the vertical blanking period are set in one field period $T_F$. Then a signal charge Q1 obtained in the first charging period is reproduced with a gain of 1, and a signal charge Q2 obtained in the second charging period is reproduced with a gain (T1/T2). As a result, when the signal charge Q1 reaches a saturation charge quantity, a management range in quantity of incident light being (T1/T2) times greater than the gain in the conventional case is achieved by using the signal information of the signal charge Q2.

In the above-mentioned element drive method for expanding the management range in the quantity of incident light, there is a proposal for dispensing with any external frame memory (Japanese Patent Laid-Open Publication No. SHO 63-250980). The above-mentioned proposal describes a method for continuously transferring signal charges obtained in two charging periods separately provided in one field period $T_F$ in a vertical CCD by producing three signal packets with four pixels and a total of eight transfer electrodes according to the structure of the current CCD, using signal charges of a mixture of two pixels in the first charging period as two packets, and using signal charges of a mixture of four pixels in the second charging period as one packet.

SUMMARY OF THE INVENTION

However, it is required to read two times during a time interval of Δ T for the purpose of additively mixing the signal charges of the mixture of four pixels. There exist two different types of signal charges T2 and (T2 +Δ T) in an identical packet. When the signal charges of the mixture of four pixels in the two types of charging periods are mutually different in time by Δ T are subjected to calculation processing with the gain of (T1/T2) without distinction, there occurs disadvantages such as misalignment in color and misalignment in luminance when adjusting the second charging period T2 according to the quantity of light of the subject.

By using a drive method and solid state image pickup device free of the difference of Δ T between charging periods in the second charging period T2 that causes problems when signal charges are read from a photoelectric converting element to a vertical CCD at least two times in one field period, the management range in the quantity of incident light can be expanded. Therefore misalignment in color and misalignment in luminance can be avoided.

The management range in quantity of incident light can be expanded to the high-luminance side without using any external field memory or any frame memory for a subject having a wide range of distribution in luminance by managing the quantity of light smaller than a standard quantity of light and the quantity of light about two times greater than the standard quantity of light with the first charging period T1 and managing a region having a saturation charge quantity in the first charging period T1 with the second charging period T2 in the vertical blanking period.

PREFERRED EMBODIMENTS

The following describes an embodiment of the present invention with reference to the drawings.

Figure 1:
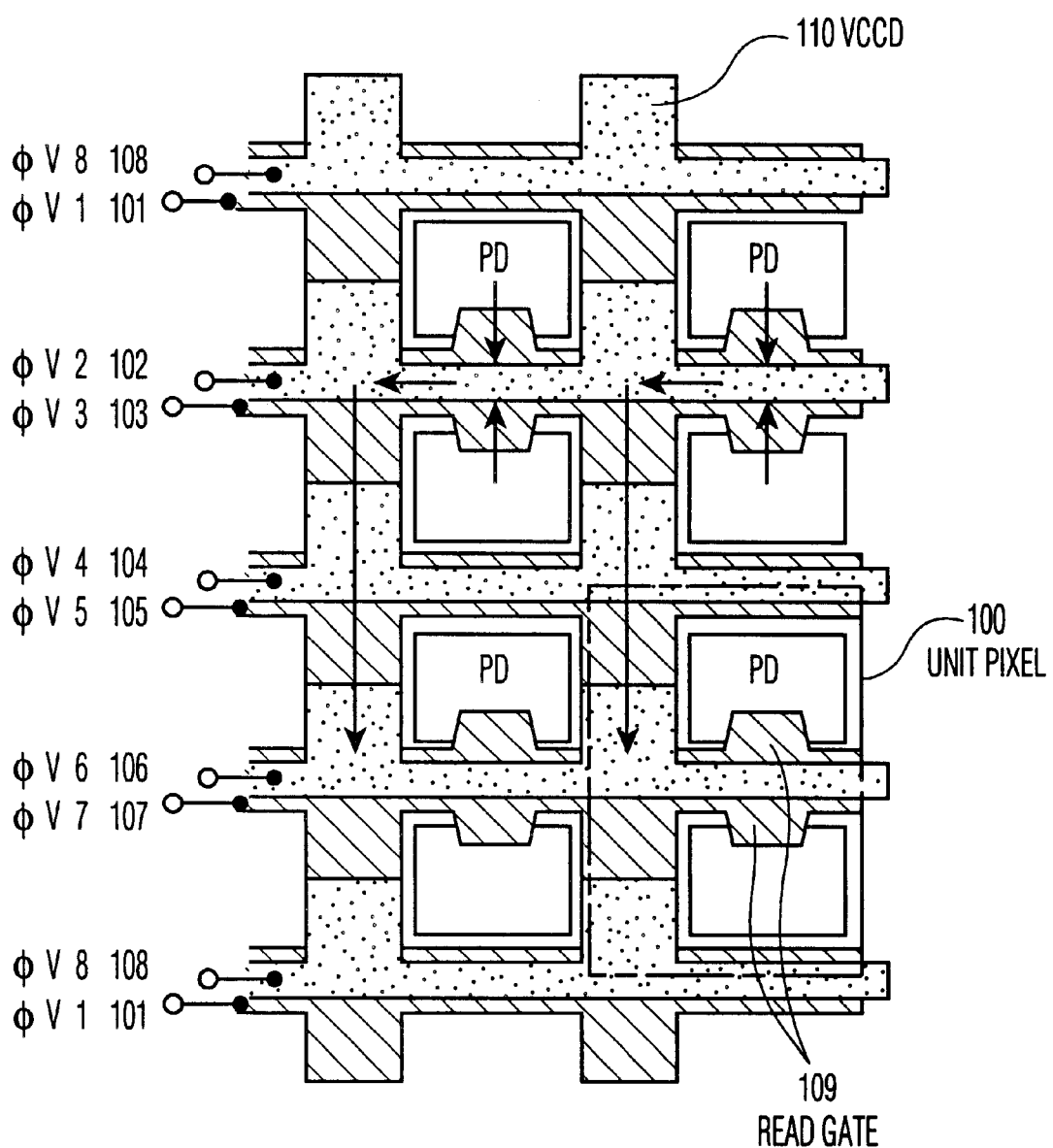
FIG. 1 is a diagram showing a solid state image pickup device of the present invention.

FIG. 1 shows an exemplified solid state image pickup device relevant to the claim 1 of the present invention.

Four transfer electrodes of a VCCD 110 correspond to a unit pixel 100, while eight transfer electrodes of φV1 transfer electrode 101, φV2 transfer electrode 102, φV3 transfer electrode 103, φV4 transfer electrode 104, φV5 transfer electrode 105, φV6 transfer electrode 106, φV7 transfer electrode 107, and φV8 transfer electrode 108 are used as a total of eight transfer electrodes to correspond to two continuous unit pixels, when an 8-phase transfer clock is applied to them. The φV2 transfer electrode 102 and the V6 transfer electrode 106 are each provided with a read gate 109. Although two read gates are provided for one read electrode by-means of a polysilicon of the first layer, the read electrode may utilize the polysilicon of either the first layer or the second layer. It is also permitted to consider that adjoining two pixels in the direction of the VCCD as one pixel in the case where the conventional CCD is used. For the element drive examples in FIG. 2 and subsequent figures, a description is provided based on the structure of FIG. 1.

Figure 2:
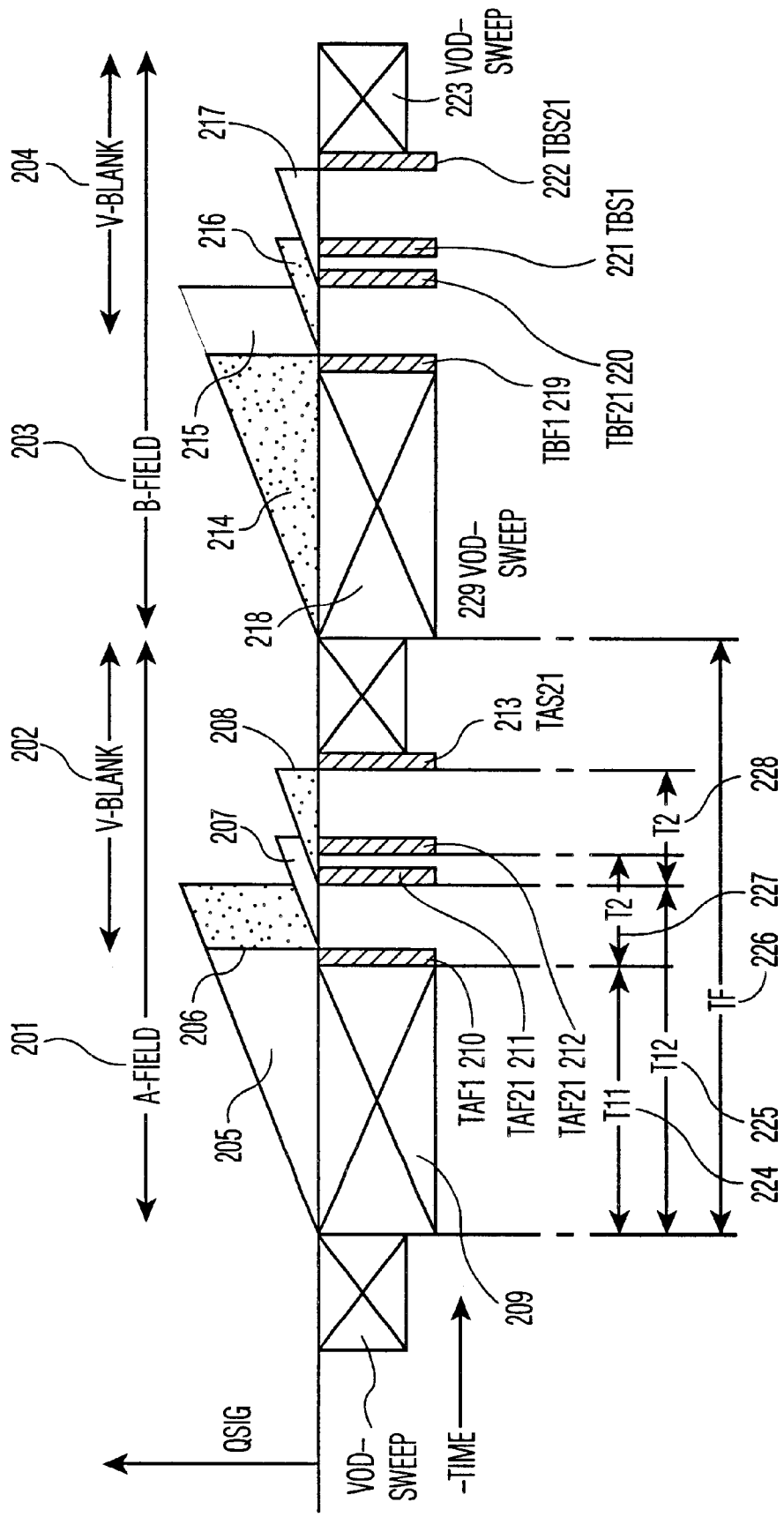
FIG. 2 is a chart for explaining a first drive method of the present invention.
Figure 3:
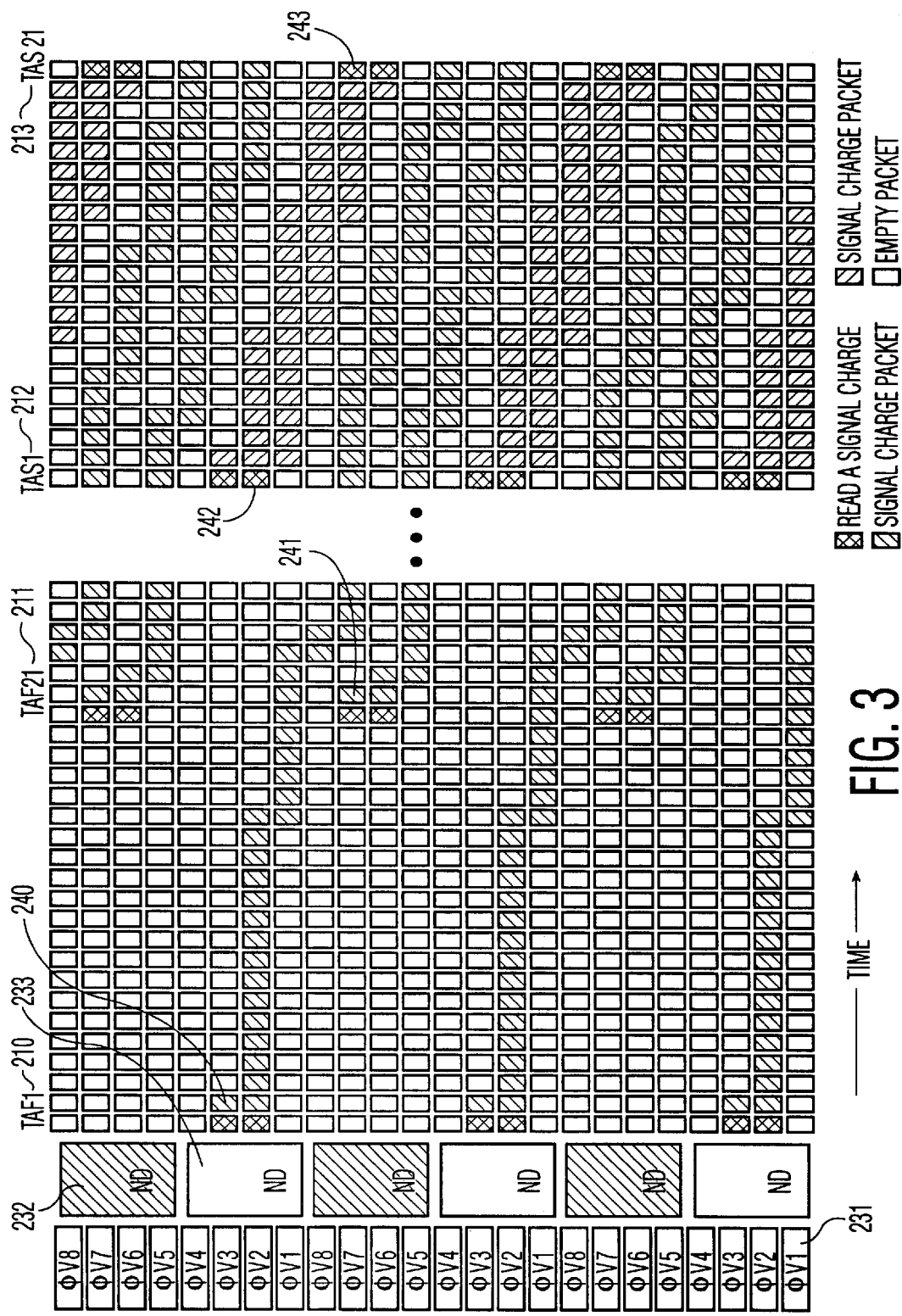
FIG. 3 is a diagram showing an A-field of a first drive embodiment of the present invention.
Figure 4:
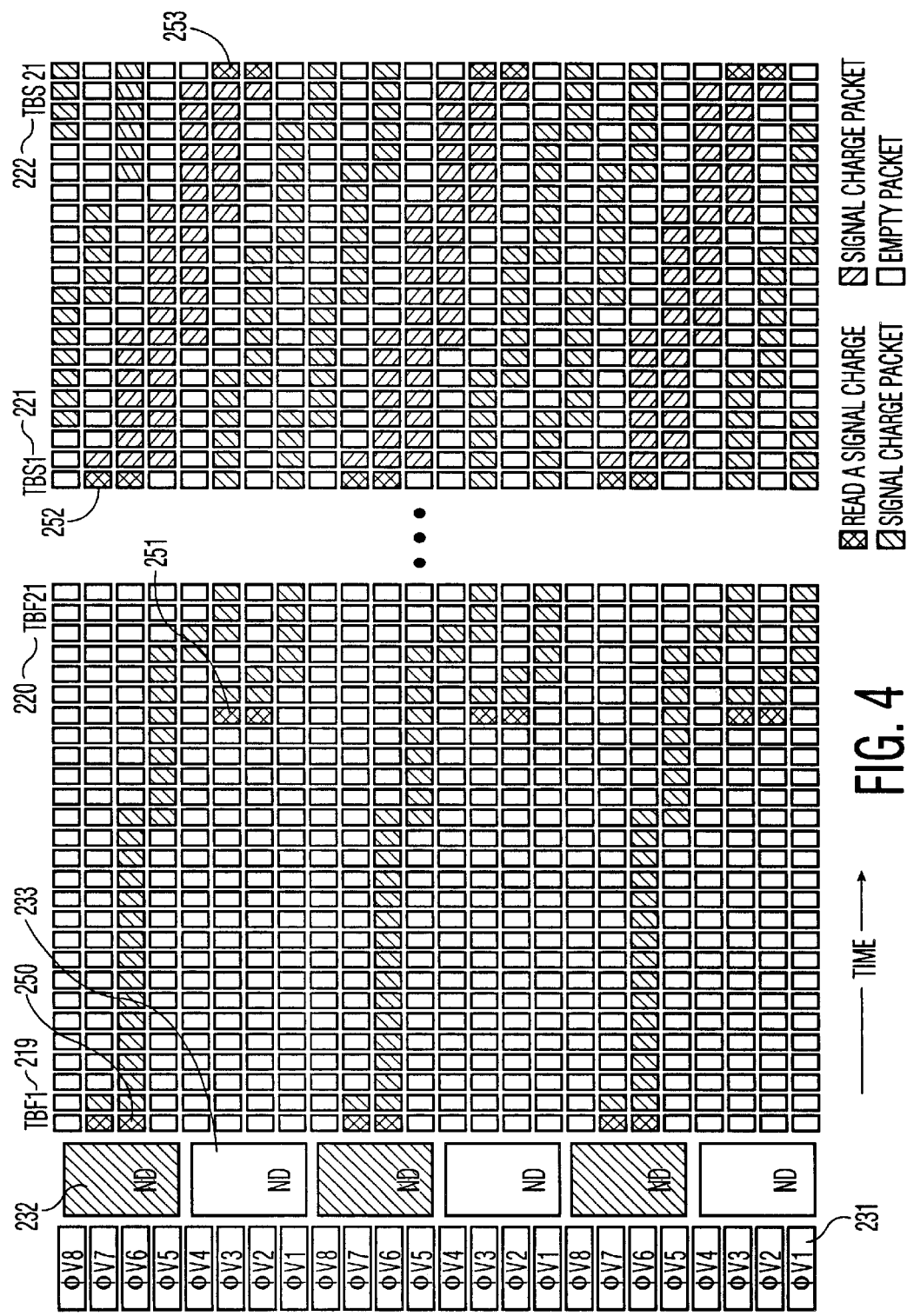
FIG. 4 is a diagram showing a B-field of the first drive embodiment of the present invention.

FIGS. 2, 3, and 4 show embodiments relevant to the claims 2, 3, and 4 by means of the solid state image pickup device shown in FIG. 1.

FIG. 2 shows an A-FIELD 201 and a B-FIELD 203 of a normal TV frame. FIG. 2 also shows the timing of charge, read, and transfer of signals in the A-FIELD 201 and B-FIELD 203 in each odd-line pixel and each even-line pixel.

The odd-line pixel 232 and the even-line pixel 233 are preliminarily made to have charge period start timing which are caused to coincide using a known electronic shuttering operation (VOD (vertical overflow drain shuttering operation) sweep).

The even-line pixel 233 obtains an even-line first signal charge 205 according to a signal input in a period T11 224. An operation of read to the VCCD is executed with timing $T_{AF1}$ 210. Meanwhile, the odd-line pixel 232 obtains an odd-line first signal charge 206 according to a signal input in a period T12 225, and an operation of read to the VCCD is executed with timing $T_{AF21}$ 211. Further in a V-blank period 202, the even-line pixel 233 obtains an even-line second signal charge 207 according to a signal input in a period T2 227. An operation of read to the VCCD is executed with timing $T_{AS1}$ 212. Meanwhile, the odd-line pixel 232 obtains an odd-line second signal charge 208 according to a signal input in a period T2 228 set up in an identical charging period with the period T2 227, and an operation of read to the VCCD is executed with timing $T_{AS21}$ 213. As a result, control of the charging times in the period T2 227 and the period T2 228 executed for the purpose of picking up a region having a high luminance of the subject in the V-blank period 202 is executed by adjusting a VOD-sweep period 229 provided within the entire field period 226.

Although the same operation is executed in the B-FIELD 203, it is permitted to replace the charging period of an odd-line first signal charge 214 with the charging period of an even-line first signal charge 215.

FIGS. 3 and 4 show the timing of the read and transfer operations. A signal charge 240 read with the timing $T_{AF1}$ 210 is transferred in the VCCD by one pixel. With the timing $T_{AF21}$ 211, a signal charge 241 is read. In FIG. 3, twenty clock pulses are used from the timing $T_{AF1}$ 210 to the timing $T_{AF21}$ 211. Subsequently, by using twenty clock pulses from the timing $T_{AS1}$ 212 to the timing $T_{AS21}$ 213, the charging periods of T2 227 and T2 228 are allowed to have the same duration. Further, a signal charge 242 corresponding to the even-line second signal charge 207 and a signal charge 243 corresponding to the odd-line second signal charge 208 are mixed with each other with the timing $T_{AS21}$ 213 in a manner as shown in FIG. 3. There is an interval of twenty clock pulses from $T_{AS1}$ 212 to $T_{AS21}$ 213 between the periods for reading both the signal charges. Subsequently, the signal charges are transferred in the VCCD according to the 8-phase clock. Although the charging periods T2 227 and T2 228 have a charging period of twenty clock pulses in this example, it is of course permitted to provide no limitation on the number of clock pulses. Meanwhile, as described hereinbefore, the charging periods of T2 227 and T2 228 are controlled by increasing or decreasing the interval from $T_{AF21}$ 211 to $T_{AS1}$ 212, according to which the VOD-sweep period 229 is increased or decreased.

Figure 5:
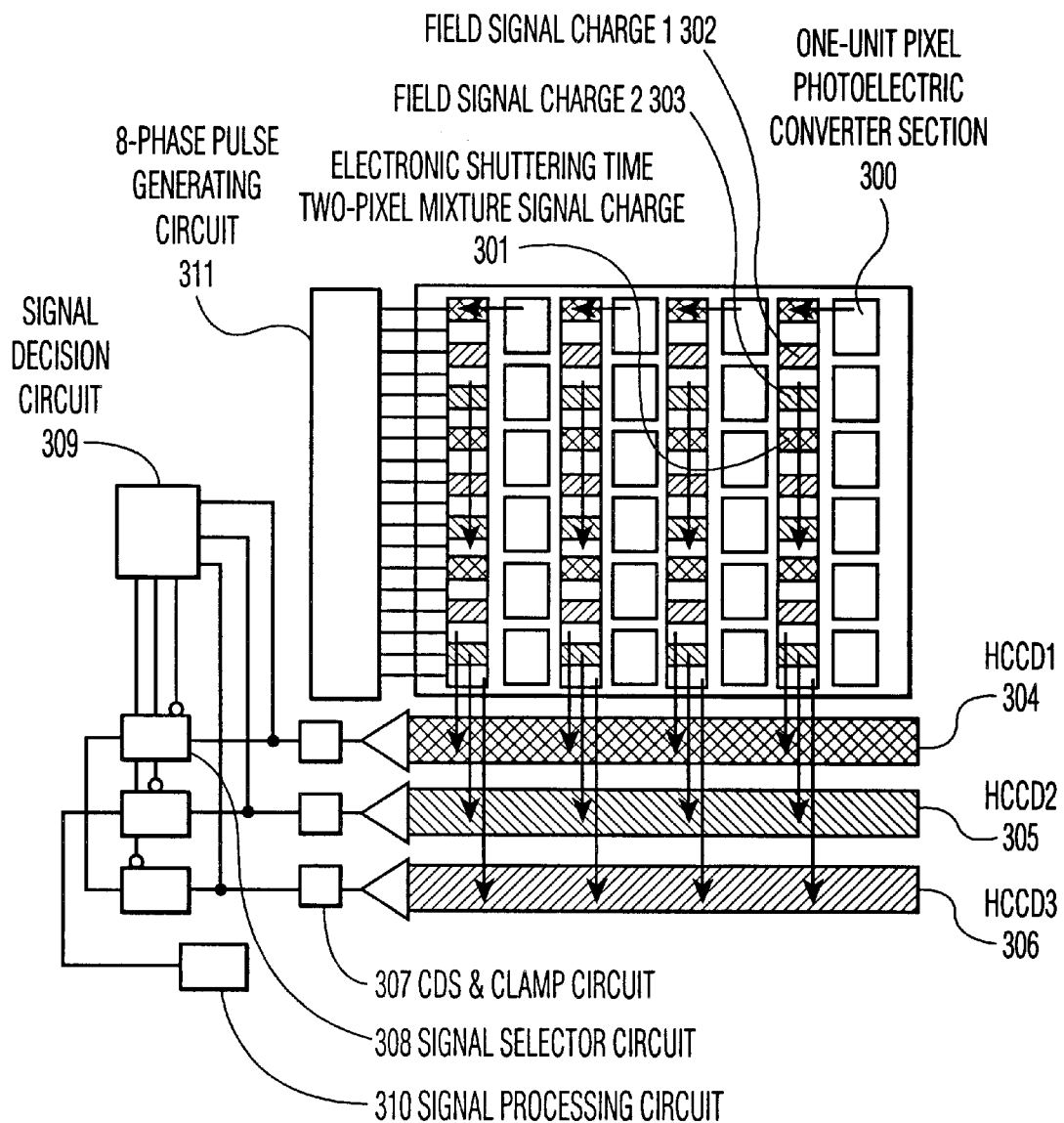
FIG. 5 is a diagram of an exemplified first solid state image pickup device of the present invention.
Figure 6:
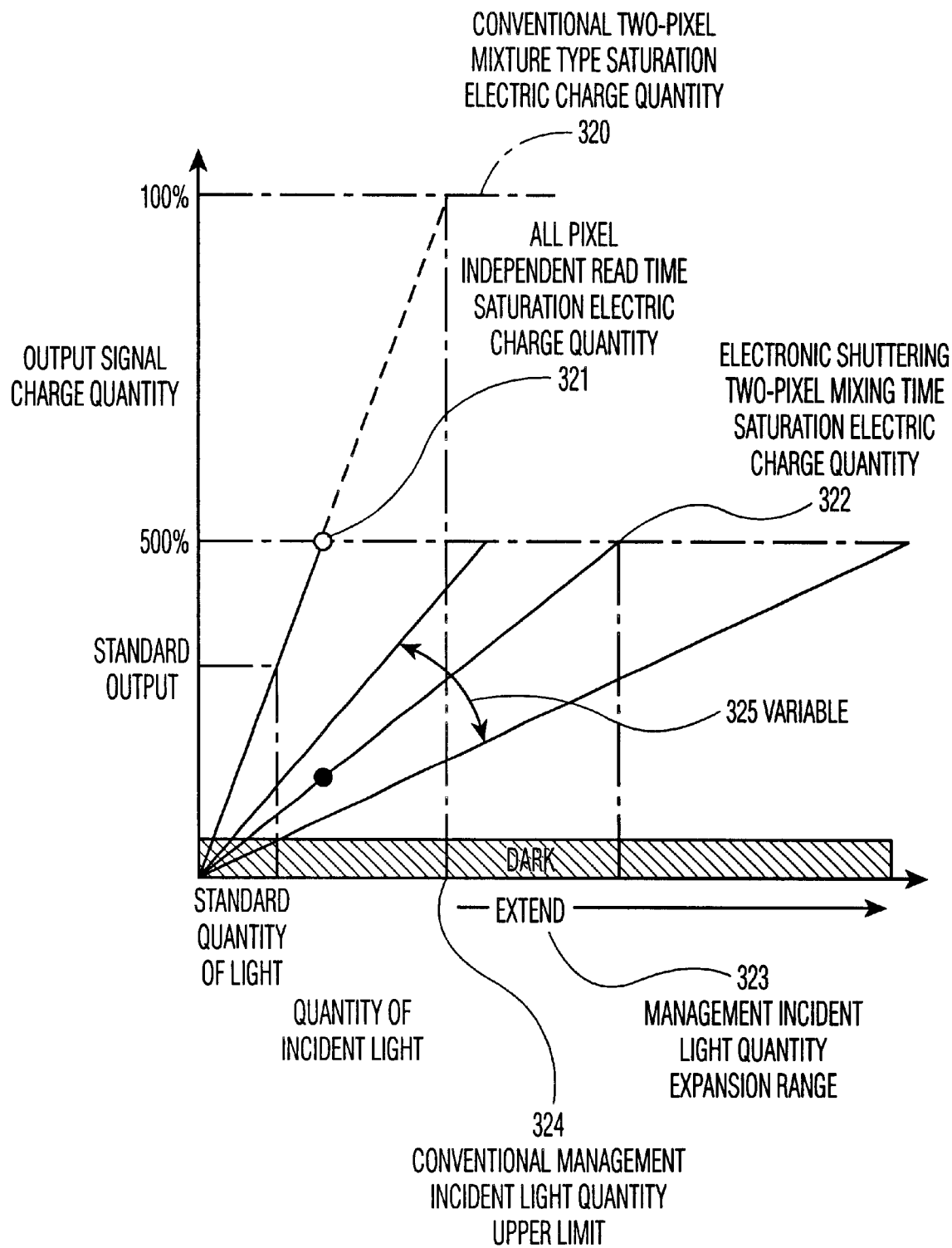
FIG. 6 is a graph for explaining the effect of the first embodiment of the present invention.

FIG. 5 shows an embodiment relevant to the claims 5, 6, and 8. FIG. 6 shows the effect of expanding the management range in quantity of incident light.

Incident light is photo-electrically converted in a one-unit pixel photoelectric converter section 300. Meanwhile, an electronic shuttering time two-pixel mixture signal charge 301, a field signal charge 1 302, and a field signal charge 2 303 are transferred respectively by HCCD1 304, HCCD2 305, and HCCD3 306. After passing through a CDS & clamp circuit 307, they are subjected to decision of signal saturation by a signal decision circuit 309 based on the saturation or unsaturation condition of signals output from all or a part of the HCCD1, 2, and 3. After being further subjected to selection of output in a signal selector circuit 308, they are subjected to calculation processing as described hereinafter in a signal processing circuit 310 to execute image signal reproduction.

An exemplified image reproducing method is shown. In the following conditional expressions, $V_T$ represents a voltage corresponding to the saturation charge quantity of an element.

First, when the condition of Equation 1 is true in regard to the signal voltages V (T1) and V (T12) in the charging periods T11 and T12, the signals V (T11) and V (T12) are selected by the signal selector circuit 308. When the condition of Equation 1 is false, the signal selector circuit 308 selects the electronic shuttering time two-pixel mixture signal charge 301, while the signal voltage in the charging period T2 is converted into Vsig (T2) in a signal processing circuit 310 through calculation of Equation 2. Although a is defined by Equation 3 in this place, it is permitted to use another appropriate value, for example, the values in Equation 4. It should be noted that the other signals which have not been selected are abandoned.

$$\max(V(T11), V(T12)) < V_T \quad \text{Equation 1:}$$

$$V\text{sig}(T2) = a \times V(T2) \quad \text{Equation 2:}$$

$$a = T11/T2 \quad \text{Equation 3:}$$

$$a = T12/T2 \quad \text{Equation 4:}$$

The expansion of the management range in quantity of incident light of the present embodiment will be described with reference to FIG. 6.

An output signal charge quantity obtained by the read and transfer operations through mixture of two pixels in a conventional CCD is shown as a conventional two-pixel mixture type saturation electric charge quantity 320. The saturation charge quantity of signal charges in the charging periods T11 224 and T12 225 shown in FIG. 2(a) come to have a value corresponding to one transfer electrode in one unit pixel in one unit pixel 100 shown in FIG. 1, and therefore the value is one fourth of the conventional two-pixel mixture type saturation electric charge quantity. In forming a luminance signal, a signal charge 240 and a signal charge 241 are added together in an external circuit, and therefore the value is half of the conventional two-pixel mixture type saturation charge quantity. The value is shown as all pixel independent read time saturation electric charge quantity 321.

According to the element and drive method of the present embodiment, a signal charge obtained by mixing the even-line second signal charge 207 in the charging period T2 227 with the odd-line second signal charge 208 in the charging period T2 228 can be independently read simultaneously, and therefore an electronic shuttering two-pixel mixing time saturation electric charge quantity 322 can be obtained. In this place, the periods T2 227 and T2 228 can be varied, for example, from 1/500 of a second to 1/2000 of a second to allow an effect as represented by variable 325 in FIG. 6 to be obtained. Therefore, a management incident light quantity expansion range 323 greater than a conventional management incident light quantity upper limit 324 can be achieved.

Figure 7:
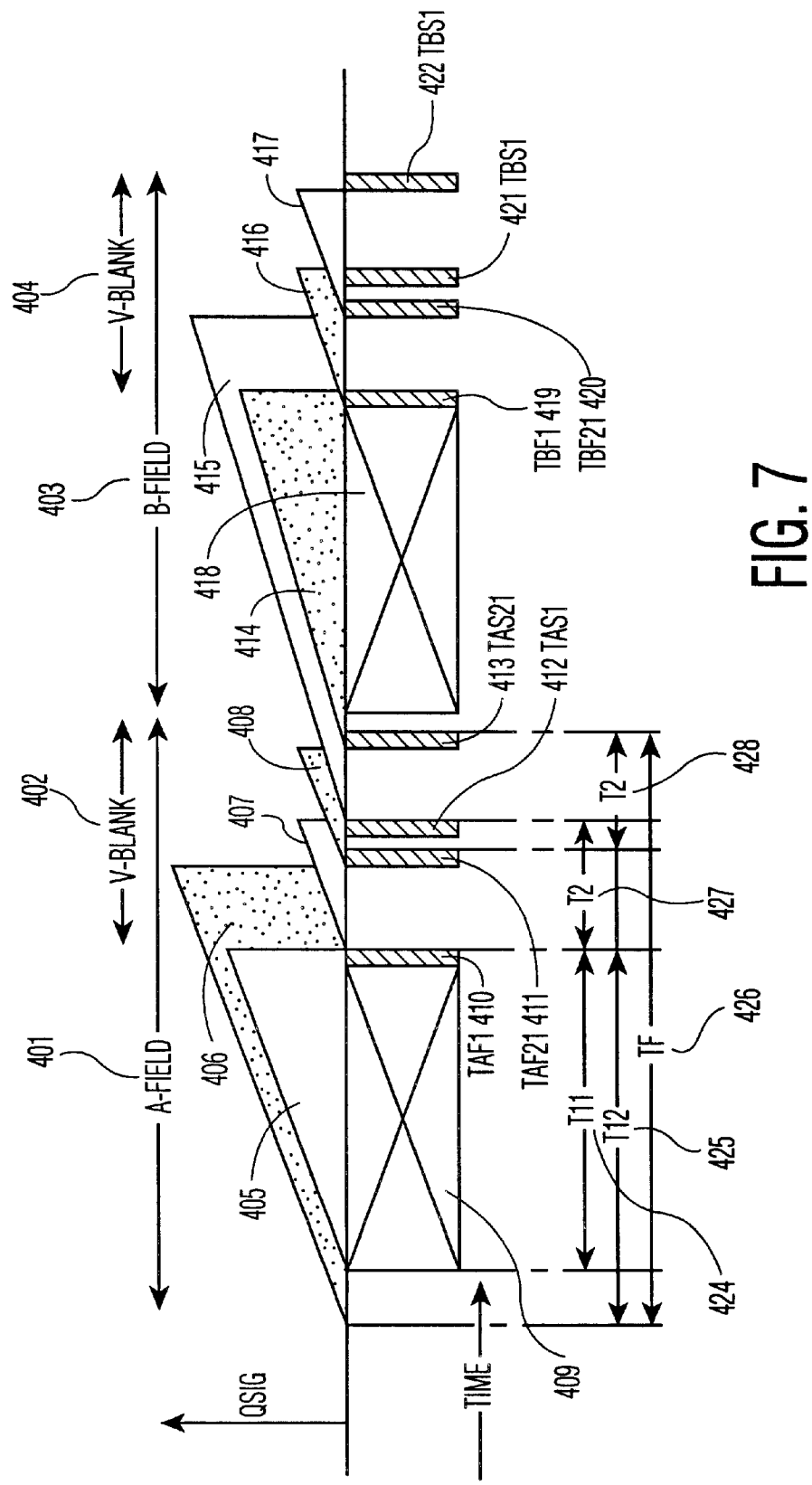
FIG. 7 is a chart for explaining a second drive method of the present invention.
Figure 8:
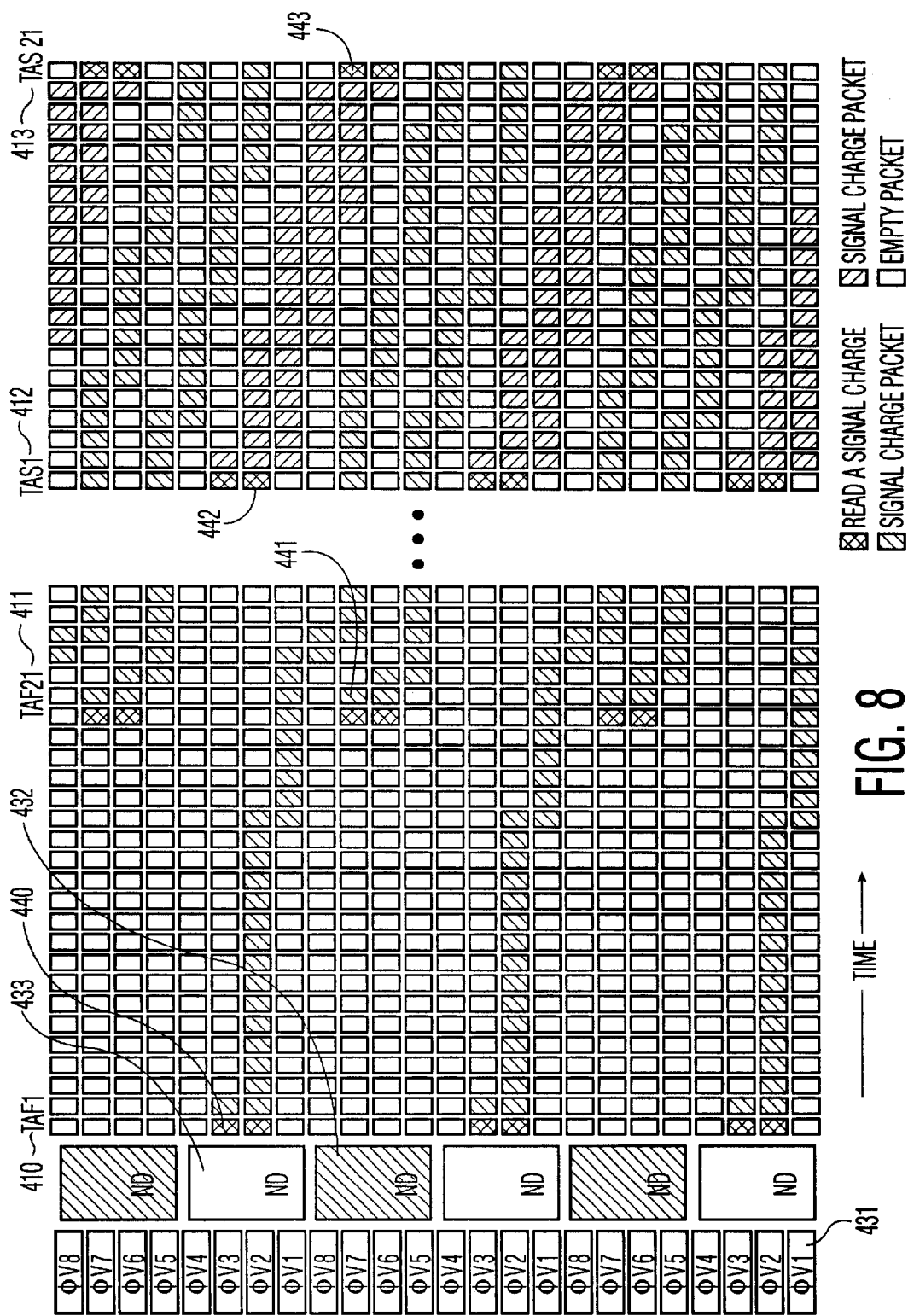
FIG. 8 is a diagram of an A-field of a second drive embodiment of the present invention.
Figure 9:
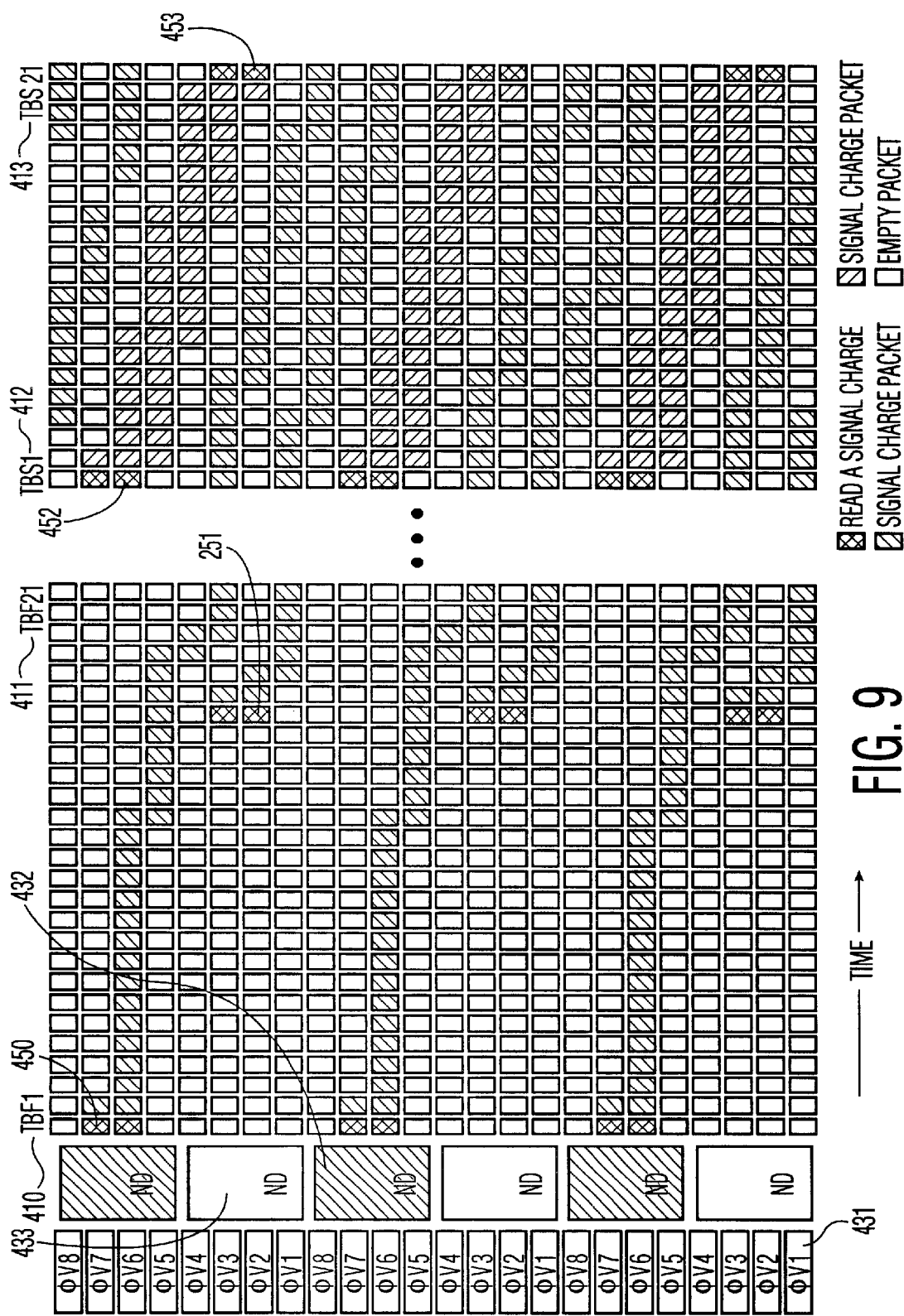
FIG. 9 is a diagram of a B-field of the second drive embodiment of the present invention.

FIGS. 7, 8, and 9 show an embodiment in the case where VOD-sweep is not used. FIG. 7 shows an odd-line pixel 432 and an even-line pixel 433 as well as the timing of signal charge, read, and transfer in an A-FIELD 401 and a B-FIELD 403 of a normal TV frame.

In this case, the charging period start timings of the odd-line pixel 432 and the even-line pixel 433 differ from each other. The even-line pixel 433 obtains an even-line first signal charge 405 according to a signal input in a period T11 424. An operation of read to the VCCD is executed with timing $T_{AF1}$ 410. Meanwhile, the odd-line pixel 432 obtains an odd-line. first signal charge 406 according to a signal input in a period T12 425, and an operation of read to the VCCD is executed with timing $T_{AF21}$ 411. Further in a V-blank period 402, the even-line pixel 433 obtains an even-line second signal charge 407 according to a signal input in a period T2 427. An operation of read to the VCCD is executed with timing $T_{AS1}$ 412. Meanwhile, the odd-line pixel 432 obtains an odd-line second signal charge 408 according to a signal input in a period T2 428 set in an identical charging period with the period T2 427, and an operation of read to the VCCD is executed with timing $T_{AS21}$ 413. In this place, the periods T11 424 and T12 425 differ from each other and also differ depending on whether they are in the A-FIELD 401 or in the B-FIELD 403. Therefore, when the periods T2 427 and T2 428 having the same charging time are controlled, there is a possibility of generating misalignment in color and misalignment in luminance in the period of four fields. However, the pixel data are read independently in the present invention, a calculation (Equation 6) which takes the ratio in charging period (Equation 5) into account can be allowed. Therefore, by using a value Vsig' (T11) calculated in terms of the charging period T12, neither misalignment in color nor misalignment in luminance takes place.

$$b = T12/T11 \qquad \text{Equation 5:}$$

$$V\text{sig}'(T11) = b \times V(T11) \qquad \text{Equation 6:}$$

FIGS. 8 and 9 show the timing of the read and transfer operations. A signal charge 440 read with the timing $T_{AF1}$ 410 is transferred in the VCCD by one pixel. With the timing $T_{AF21}$ 411, a signal charge 441 is read. In FIG. 3, twenty clock pulses are used from the timing $T_{AF1}$ 410 to the timing $T_{AF21}$ 411. Subsequently, by aligning the timing from $T_{AS1}$ 412 to the timing $T_{AS21}$ 413 in twenty clock pulses, the charging periods in the period T2 427 and T2 428 are allowed to have an identical duration. Further, after a signal charge 442 corresponding to the even-line second signal charge 407 is transferred by one pixel in the period of twenty clock pulses, a signal charge 443 corresponding to the odd-line second signal charge 408 is read through superimposition with the timing $T_{AS21}$ 412 in a manner as shown in FIG. 3 to be mixed with the signal charge and subsequently transferred in the VCCD according to the 8-phase clock. Although the charging periods T2 427 and T2 428 correspond to twenty clock pulses in this example, it is of course permitted to provide no limitation on the number of clock pulses.

Figure 10:
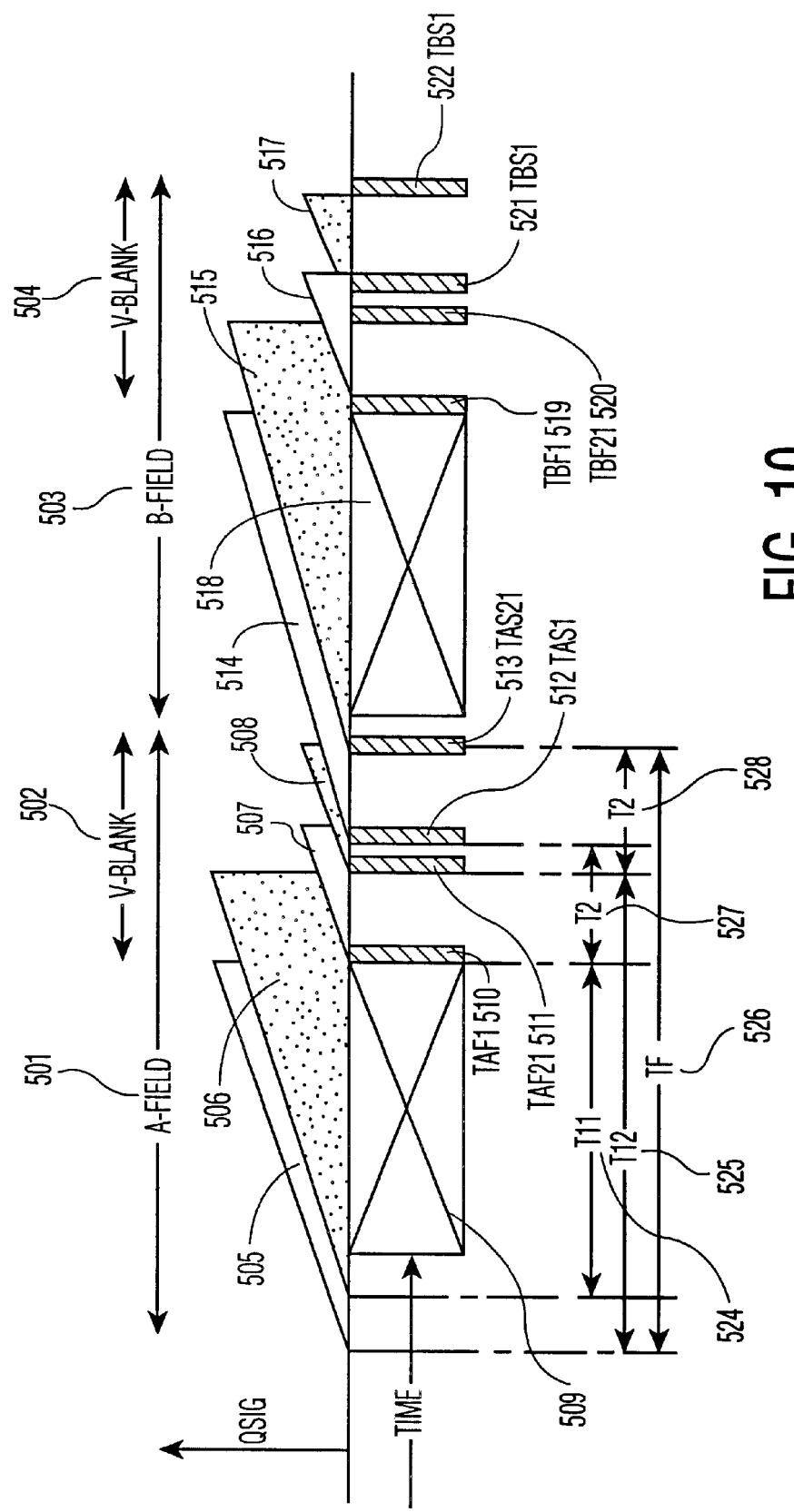
FIG. 10 is a chart for explaining a third drive method of the present invention.

FIG. 10 shows a case where the charging period of an odd-line first signal charge 414 and the charging period of an even-line first signal charge 415 as shown in FIG. 7 are replaced with each other. In this place, an even-line first signal charge 505 is a signal charge obtained from a signal input in a period T11 524. An operation of read to the VCCD is executed with timing $T_{AF1}$ 510. An odd-line first signal charge 506 is a signal charge obtained from a signal input in a period T12 525, and an operation of read to the VCCD is executed with timing $T_{AF2}$ 511. An even-line second signal charge 507 is a signal obtained from a signal input in a period T2 527. An operation of read to the VCCD is executed with timing $T_{AS1}$ 512. An odd-line second signal charge 508 is a signal obtained from a signal input in a period T2 528, and an operation of read to the VCCD is executed with timing $T_{AS2}$ 513.

In the present invention, the periods T11 524 and T12 525 can be set up at an identical duration, the conversion of Equation 6 is not necessary.

As described above, in the present invention, the management range in quantity of incident light can be expanded to the high-luminance side without using any field memory or any frame memory.

What is claimed is:

1. A method for driving a solid state image pickup device having a plurality of unit pixel means where each one of the plurality of unit pixel means corresponds to a pixel means having at least one input converting section, and CCD electric charge transfer means, the method comprising the steps of:

setting only a single first signal charging period and only a single second signal charging period in each field for each one of the plurality of unit pixel means, where the single second signal charging period occurs after the single first signal charging period and is shorter than the single first signal charging period;

setting, in each field, the single first single charging period of a first unit pixel means and the single first charging period of a second unit pixel means so that the single first signal charging periods for the first and second unit pixel means have coinciding start times, the first and second unit pixel means are adjacent to each other in a vertical direction;

setting, in each field, the single second signal charging period of the first unit pixel means and the single second signal charging period of the second unit pixel means so that the single second signal charging periods for the first and second unit pixel means have different start times and similar time duration during which a second signal charge is produced within each unit pixel means; and adding the second signal charge of the first unit pixel means to the second signal charge of the second unit pixel means for output by the CCD electric charge transfer means.

2. The method for driving a solid state image pickup device according to claim 1 wherein the second signal charging period is controlled using an electronic shuttering operation within each field.

3. A method for driving a solid state image pickup device having a plurality of unit pixel means where each one of the plurality of unit pixel means corresponds to a pixel means having at least one input converting section, and CCD electric charge transfer means, the method comprising the steps of:

setting only a single first signal charging period and only a single second signal charging period in each field for each one of the plurality of unit pixel means, where the single second signal charging period occurs after the single first signal charging period and is shorter than the single first signal charging period;

setting, in each field, the single second signal charging period of a first unit pixel means and the single second signal charging period of a second unit pixel means so that the single second signal charging periods for the first and second unit pixel means have different start times and similar time duration during which a second signal charge is produced within each unit pixel means, the first and second unit pixel means are adjacent to each other in a vertical direction; and adding the second signal charge of the first unit pixel means to the second signal charge of the second unit pixel means for output by the CCD electric charge transfer means.

4. The method for driving a solid state image pickup device according to claim 3, wherein the second signal charging period is controlled using an electronic shuttering operation within the field.

5. A solid state image pickup device comprising:

a plurality of unit pixel means arranged in a two dimensional matrix with a horizontal axis and a vertical axis where each one of said plurality of unit pixel means corresponds to one pixel in an image, each one of said plurality of unit pixel means comprising:
(1) at least one input converting section,
(2) CCD electric charge transfer means, and
(3) four transfer electrodes;

wherein eight transfer electrodes are provided for two unit pixel means adjacent to each other in a vertical direction;

pulse generating means for driving the eight transfer electrodes;

means for setting a first signal charging period and a second signal charging period during one frame or field of a video signal for each one of the plurality of unit pixel means, where the second signal charging period occurs after the first signal charging period and is shorter than the first signal charging period;

means for setting the second signal charging period during one frame or field for the two unit pixel means which are adjacent to each other in the vertical direction so that the second signal charging period for each of the two unit pixel means have different start times and similar time durations; and means for adding signal charges of the two unit pixel means from the second charging periods.

6. A method for driving a solid state image pickup device, the method comprising the steps of:

(a) setting a first signal charging period and a second signal charging period during one frame or field of a video signal for each one of a plurality of unit pixel means, the plurality of unit pixel means being arranged in a matrix with horizontal rows, where the second signal charging period is shorter than the first signal charging period and a first signal charge is produced during the first signal charging period and a second signal charge is produced during the second signal charging period;

wherein the second signal charges of pairs of unit pixel means which are vertically adjacent are added;

(b) judging whether the first signal charge is saturated or not saturated.

7. The method for driving a solid state image pickup device according to claim 6, wherein step (b) includes the step of enlarging the second signal charge in proportion to a ratio of the first signal charging period to the second signal charging period.

8. The method for driving a solid state image pickup device according to claim 7, wherein when an electric charge is transferred using a vertical CCD electric charge transfer means having four electrodes provided for one unit pixel, the first signal charge obtained during the first signal charging period and the second signal charge obtained during the second signal charging period are transferred together in said vertical CCD electric charge transfer means.

9. The method for driving a solid state image pickup device according to claim 6, wherein when an electric charge is transferred using a vertical CCD electric charge transfer means having four electrodes provided for one unit pixel, the first signal charge obtained during the first signal charging period and the second signal charge obtained during the second signal charging period are transferred together in said vertical CCD electric charge transfer means.

* * * * *

UNITED STATES PATENT AND TRADEMARK OFFICE
CERTIFICATE OF CORRECTION

PATENT NO.    : 6,392,700 B1
DATED         : May 21, 2002
INVENTOR(S)   : Komobuchi et al.

It is certified that error appears in the above-identified patent and that said Letters Patent is hereby corrected as shown below:

Title page,
Item [56], References Cited, U.S. PATENT DOCUMENTS,
U.S. Patent Document "4,794,093", delete "Murayana" and substitute therefor
-- Murayama --.
U.S. Patent Document "5,229,857", delete "Tanji" and substitute therefore -- Taniji --.
U.S. Patent Document "5,438,365", after "Yamashita" insert -- et al. --.

Column 6,
Line 32, delete the second occurrence of the word "single" and substitute therefor
-- signal --.

Signed and Sealed this

Twenty-seventh Day of May, 2003

JAMES E. ROGAN
*Director of the United States Patent and Trademark Office*